United States Patent
Smith et al.

(10) Patent No.: US 8,731,490 B2
(45) Date of Patent: May 20, 2014

(54) METHODS AND CIRCUITS FOR DETUNING A FILTER AND MATCHING NETWORK AT THE OUTPUT OF A POWER AMPLIFIER

(71) Applicant: RF Micro Devices (Cayman Islands), Ltd., Greensboro, NC (US)

(72) Inventors: Malcolm Smith, San Jose, CA (US); Ying Shi, Saratoga, CA (US)

(73) Assignee: RF Micro Devices (Cayman Islands), Ltd., George Town (KY)

( * ) Notice: Subject to any disclaimer, the term of this patent is extended or adjusted under 35 U.S.C. 154(b) by 0 days.

(21) Appl. No.: 13/633,374

(22) Filed: Oct. 2, 2012

(65) Prior Publication Data

US 2014/0030990 A1 Jan. 30, 2014

Related U.S. Application Data

(60) Provisional application No. 61/676,339, filed on Jul. 27, 2012.

(51) Int. Cl.
*H04B 1/04* (2006.01)

(52) U.S. Cl.
USPC .............. 455/114.1; 455/78; 455/80; 455/93; 455/124; 455/127.4; 375/216

(58) Field of Classification Search
CPC .................................................. H04B 1/0475
USPC ................. 455/114.1, 78, 80, 93, 124, 127.4; 375/216
See application file for complete search history.

(56) References Cited

U.S. PATENT DOCUMENTS

| | | | |
|---|---|---|---|
| 2,681,953 A | 6/1954 | Bradburd | |
| 2,797,267 A | 6/1957 | Yost, Jr. | |
| 3,151,301 A | 9/1964 | Bettin | |
| 3,287,653 A | 11/1966 | Goordman | |
| 3,441,865 A | 4/1969 | Siwko | |
| 3,524,142 A | 8/1970 | Valdettaro | |
| 3,959,603 A | 5/1976 | Nilssen et al. | |
| 4,032,973 A | 6/1977 | Haynes | |
| 4,087,761 A | 5/1978 | Fukumoto et al. | |
| 4,232,270 A | 11/1980 | Marmet et al. | |
| 4,511,857 A | 4/1985 | Gunderson | |
| 4,772,858 A | 9/1988 | Tsukii et al. | |
| 4,791,421 A | 12/1988 | Morse et al. | |
| 4,977,366 A | 12/1990 | Powell | |
| 5,023,566 A | 6/1991 | El-Hamamsy et al. | |
| 5,412,344 A | 5/1995 | Franck | |
| 5,521,561 A | 5/1996 | Yrjola et al. | |
| 5,589,796 A | 12/1996 | Alberth, Jr. et al. | |
| 6,060,752 A | 5/2000 | Williams | |
| 6,188,877 B1 * | 2/2001 | Boesch et al. | 455/74 |

(Continued)

*Primary Examiner* — Sanh Phu
(74) *Attorney, Agent, or Firm* — Withrow & Terranova, P.L.L.C.

(57) ABSTRACT

In transmitter modules or power amplifier (PA) modules there is at least a possible path for a second and even a third harmonic of a low band to crossover unfiltered into the high band path and reach the antenna and hence cross band isolation is necessary. Forward isolation is necessary in order to limit the input crossing over the PAs into the antenna port. According to the methods and the circuits such cross band isolation and forward isolation is improved by detuning the filter and matching network at the output of the PA. The circuit comprises a trap at the harmonic frequencies of the low band thereby at least reducing the impacts of the cross band and forward isolation.

7 Claims, 2 Drawing Sheets

(56) References Cited

U.S. PATENT DOCUMENTS

| | | | |
|---|---|---|---|
| 6,271,727 | B1 | 8/2001 | Schmukler |
| 6,411,098 | B1 | 6/2002 | Laletin |
| 6,696,902 | B2 | 2/2004 | Lerke et al. |
| 6,741,483 | B1 | 5/2004 | Stanley |
| 6,828,862 | B2 | 12/2004 | Barak |
| 6,841,981 | B2 | 1/2005 | Smith et al. |
| 6,990,357 | B2 | 1/2006 | Ellä et al. |
| 7,003,265 | B2 | 2/2006 | Jeon et al. |
| 7,079,816 | B2 | 7/2006 | Khorram et al. |
| 7,120,399 | B2 | 10/2006 | Khorram |
| 7,138,872 | B2 | 11/2006 | Blednov |
| 7,155,252 | B2 | 12/2006 | Martin et al. |
| 7,180,373 | B2 | 2/2007 | Imai et al. |
| 7,187,945 | B2 | 3/2007 | Ranta et al. |
| 7,245,887 | B2 | 7/2007 | Khorram |
| 7,260,363 | B1 | 8/2007 | Snodgrass |
| 7,269,441 | B2 | 9/2007 | Ellä et al. |
| 7,292,098 | B2 | 11/2007 | Chen et al. |
| 7,315,438 | B2 | 1/2008 | Hargrove et al. |
| 7,365,605 | B1 | 4/2008 | Hoover |
| 7,420,416 | B2 | 9/2008 | Persson et al. |
| 7,420,425 | B2 | 9/2008 | Tsai |
| 7,427,894 | B2 * | 9/2008 | Dow et al. .................. 330/51 |
| 7,449,946 | B1 | 11/2008 | Hoover |
| 7,468,638 | B1 | 12/2008 | Tsai et al. |
| 7,623,859 | B2 | 11/2009 | Karabinis |
| 7,639,084 | B2 | 12/2009 | Liao et al. |
| 7,652,464 | B2 | 1/2010 | Lang et al. |
| 7,663,444 | B2 | 2/2010 | Wang |
| 7,768,350 | B2 | 8/2010 | Srinivasan et al. |
| 7,869,773 | B2 | 1/2011 | Kuijken |
| 7,890,063 | B2 | 2/2011 | Ahn et al. |
| 7,920,833 | B2 | 4/2011 | Qiao et al. |
| 7,924,209 | B2 | 4/2011 | Kuo et al. |
| 7,948,305 | B2 | 5/2011 | Shirokov et al. |
| 7,986,186 | B2 | 7/2011 | Marbell et al. |
| 8,027,175 | B2 | 9/2011 | Liu et al. |
| 2003/0078011 | A1 | 4/2003 | Cheng et al. |
| 2003/0193371 | A1 | 10/2003 | Larson et al. |
| 2005/0052296 | A1 | 3/2005 | Manlove et al. |
| 2005/0122163 | A1 | 6/2005 | Chu |
| 2007/0008236 | A1 | 1/2007 | Tillery et al. |
| 2007/0075784 | A1 | 4/2007 | Pettersson et al. |
| 2007/0188224 | A1 * | 8/2007 | Dow et al. .................. 330/129 |
| 2008/0102762 | A1 | 5/2008 | Liu et al. |
| 2008/0129642 | A1 | 6/2008 | Ahn et al. |
| 2009/0073078 | A1 | 3/2009 | Ahn et al. |
| 2009/0195946 | A1 | 8/2009 | Kleveland |
| 2009/0296855 | A1 | 12/2009 | Kitamura et al. |
| 2010/0063497 | A1 | 3/2010 | Orszulak |
| 2010/0105340 | A1 | 4/2010 | Weissman |
| 2010/0203922 | A1 | 8/2010 | Knecht et al. |
| 2010/0321096 | A1 | 12/2010 | Sudjian |
| 2011/0025408 | A1 | 2/2011 | Cassia et al. |
| 2011/0074509 | A1 | 3/2011 | Samavedam et al. |
| 2011/0143690 | A1 | 6/2011 | Jerng et al. |
| 2011/0148521 | A1 | 6/2011 | Albers et al. |
| 2011/0199146 | A1 | 8/2011 | Bakalski et al. |
| 2011/0242858 | A1 | 10/2011 | Strzalkowski |
| 2012/0049925 | A1 | 3/2012 | Ha et al. |
| 2012/0139639 | A1 | 6/2012 | Scott et al. |
| 2012/0139643 | A1 | 6/2012 | Scott et al. |
| 2012/0139645 | A1 | 6/2012 | Ho et al. |
| 2012/0146722 | A1 | 6/2012 | Scott et al. |

\* cited by examiner

US 8,731,490 B2

METHODS AND CIRCUITS FOR DETUNING A FILTER AND MATCHING NETWORK AT THE OUTPUT OF A POWER AMPLIFIER

CROSS-REFERENCE TO RELATED APPLICATIONS

This application claims the benefit of U.S. Provisional Patent Application No. 61/676,339 filed Jul. 27, 2012.

BACKGROUND OF THE INVENTION

1. Field of the Invention

The invention generally relates to transmitter and/or power amplifiers, more specifically to transmitters and power amplifiers operating in at least high band and low band frequencies, and even more specifically to methods and circuits for preventing, or otherwise reducing, the adverse effects of harmonic low band frequencies reaching the output of the transmitter or the power amplifier.

2. Prior Art

In transmitter modules and/or power amplifier (PA) modules there are two problems that may impact their performance. One is the frequency cross band where the second or even the third harmonics of the low band crossover the high band and reach the antenna port. The extent to which this is prevented is referred to as the cross band isolation of the circuit. The better the cross isolation the better the performance of the transmitter or PA module. The other problem is that of the input signal reaching the antenna port by crossing over the transmitter or PA module, and hence forward isolation is required.

The path of each of the forward crossover (170) and band crossover (160) are shown in FIG. 1. A transmitter circuit 100 is comprised of a high band (HB) PA 110 and a low band (LB) PA. The HB PA 110 is coupled to a HB filter 120 and the LB PA 130 is coupled to a LB filter 140. The HB filter 120 and the LB filter 140 are coupled to a switch 150 that routes the signal from one of the HB path or the LB path to an antenna. The LB crossover path (160) is a result of higher harmonic frequencies of the LB frequency $f_{LB}$, for example $2*f_{LB}$ and $3*f_{LB}$ that are passed through the HB PA 110 and HB filter 120 to the switch 150 and therefrom to the antenna, and being an unwanted result. The forward crossover path 170 demonstrates the case of an input frequency crossing over the LB PA 130 and the LB filter 140 finding their way to the antenna path, again being an unwanted result.

While prior art suggests various ways to reduce such adverse effects there is always room for improvement in this area. Therefore, in view of existing deficiencies in the prior art, it would be advantageous to provide an improved solution for both the forward isolation and the cross band isolation in transmitter and PA modules.

DETAILED DESCRIPTION OF THE PREFERRED EMBODIMENTS

In transmitter modules or power amplifier (PA) modules there is at least a possible path for a second and even a third harmonic of a low band to crossover unfiltered into the high band path and reach the antenna and hence cross band isolation is necessary. Forward isolation is necessary in order to limit the input crossing over the PAs into the antenna port. According to the methods and the circuits such cross band isolation and forward isolation is improved by detuning the filter and matching network at the output of the PA. The circuit comprises a trap at the harmonic frequencies of the low band thereby at least reducing the impacts of the cross band and forward isolation.

Figure 1:
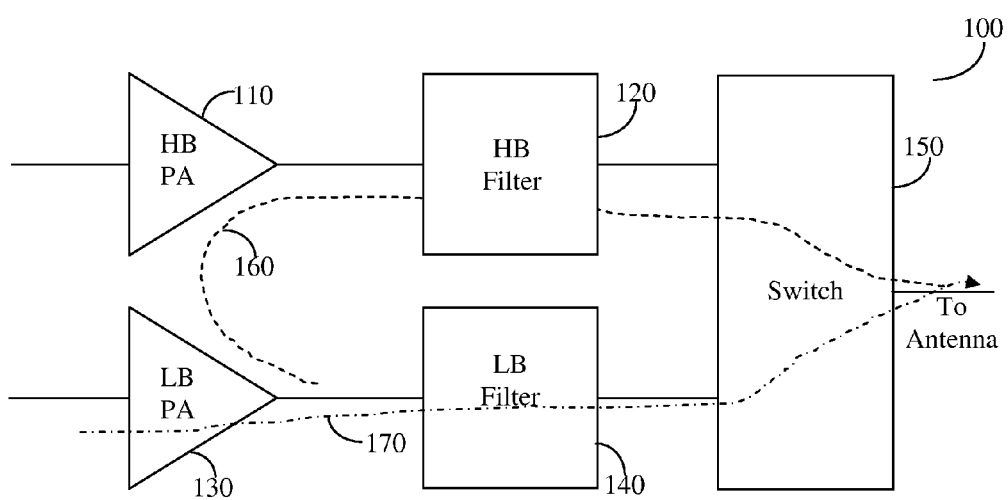
FIG. 1 is a schematic diagram of a prior art forward crossover and band crossover in a transmitter module or power amplifier module.
Figure 2:
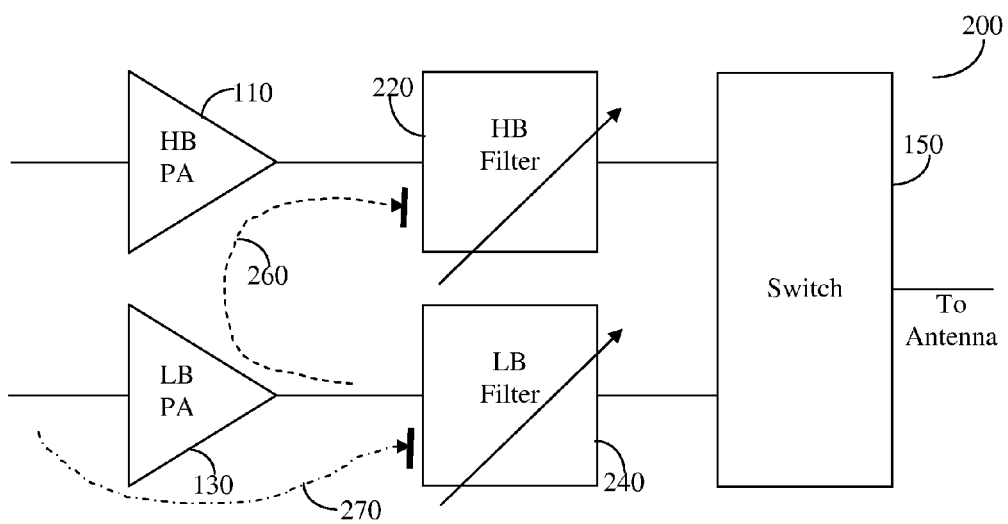
FIG. 2 is a schematic diagram of a principle of the invention using detuning filters to block band crossover and forward crossover.

In exemplary and non-limiting FIG. 2 a schematic diagram 200 of a principle of the invention using detuning filters 220 and 240 to block band crossover 260 and forward crossover 270 are shown. By using detuning filters it is possible to prevent the impact of the undesired results of either one of the band crossover and the forward crossover by providing improved isolation with respect to prior art solutions. The detuning filters 220 and 240 are designed to operate as frequency traps for the harmonics of $f_{LB}$, i.e., at frequencies of $n*f_{LB}$, where 'n' is an integer equal to 2 or larger. Accordingly, the matching network has two settings. For example, during HB operation, the first setting, which is a nominal setting, is used to convert the external load into an optimal load for the HB PA. During the LB operation, the second setting is used, which substantially filters out, or traps, the harmonics leakage from the LB, and as further described with respect of FIG. 3 herein below. It should be noted that the switch 150 may be replaced by a diplexer to allow for a switchless solution, the switch and diplexer being examples of a signal routing circuit. In one embodiment, the low frequency band and the high frequency band are non-overlapping.

Figure 3:
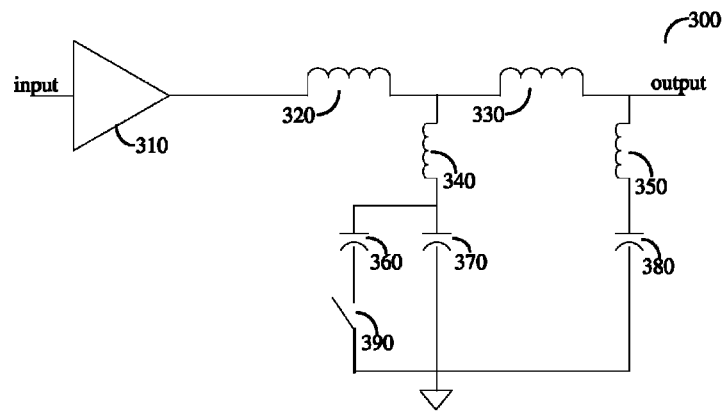
FIG. 3 is a block diagram of a circuit that contains a detuning filter according to an embodiment of the invention.

FIG. 3 depicts an exemplary and non-limiting circuit 300 that contains a detuning filter according to an embodiment of the invention. The filter coupled to the HB PA 310 comprises inductors 320, 330, 340 and 350, as well as capacitors 370 and 380, which may be found also in prior art circuits. According to the invention a capacitor 360 is added to the filter circuit that may be connected by means of a controlled switch 390 in parallel of capacitor 370, thereby increasing the overall capacitance at a terminal of the inductor 340. During HB mode, capacitor 360 is switched out, and the HB PA 310 operates as a traditional PA known from the prior art. During LB mode, capacitor 360 is switched in by means of the controlled switch 390, providing a low impedance path that substantially reduces the harmonics content leaking from the LB PA. While it is shown herein that the capacitor 360 is connected with respect of capacitor 370 it is also possible to connect the capacitor 360 with a controlled switch 390 in parallel of capacitor 380 without departing from the scope of the invention. More generally, the filter presents a first impedance when operating in the HB mode and a second impedance when operating in LB mode, the second impedance being lower than the first impedance so that the impact of the harmonics of $f_{LB}$ are substantially reduced. It should be noted that in some embodiments of the invention the combination of, for example, capacitors 360, 370 and the switch 390 may be replaced by a switched capacitor or an analog varactor, or other like circuits that enable the change of the capacitance in a way that achieves the desired results described herein.

Figure 4:
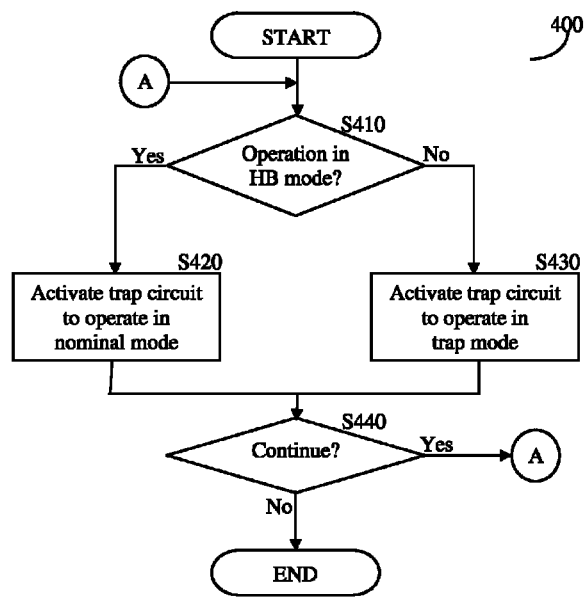
FIG. 4 is a flowchart depicting the operation of an embodiment of the invention.

Referring to FIG. 4, there is shown and exemplary and non-limiting flowchart 400 of the operation of an embodiment of the invention. In S410 it is checked whether the circuit, for example circuit 300, is operating in HB mode and if so, execution continues with S420; otherwise, execution continues with S430. In S420 the harmonic trap circuit, for example by operation of the switch 390 shown in FIG. 3, is enabled to operate in nominal mode, i.e., in the case of circuit 300 the switch 390 is open thereby disconnecting the capacitor 360. However, in other embodiments, the trap circuit may be set such that the value of a capacitor is adapted for operation in the case of the HB mode. In S430, the harmonic trap circuit is set to operate in trap mode, i.e., in the case of circuit 300, causing the connection of the capacitor 360 in parallel of capacitor 370 by closing the switch 390. However, in other embodiments, the trap circuit may be set such that the value of a capacitor is adapted for operation in the case of the LB mode. In S440 it is checked whether the operation of the method should continue and if so execution continues with S410; otherwise, execution terminates. It should be noted that while the description herein was with respect to the operation of the tuned filter of the HB path, a person of ordinary sill in the art would readily adapt the circuit to properly operate in the LB path without departing from the scope of the invention.

While the disclosed invention is described hereinabove with respect to specific exemplary embodiments, it is noted that other implementations are possible that provide the advantages described hereinabove, and which do not depart from the spirit of the inventions disclosed herein. Such embodiments are specifically included as part of this invention disclosure which should be limited only by the scope of its claims. Furthermore, the apparatus disclosed in the invention may be implemented as a semiconductor device on a monolithic semiconductor.

What is claimed is:

1. Circuitry comprising:
   a first power amplifier (PA) configured to operate in one of an ON state, in which the first PA amplifies one or more signals about a first frequency band, or an OFF state;
   a first filter coupled to the first PA and configured to pass signals about the first frequency band between an output of the first PA and a first antenna node;
   a second power amplifier (PA) configured to operate in one of an ON state, in which the second PA amplifies one or more signals about a second frequency band that is different from the first frequency band, or an OFF state;
   a second filter coupled to the second PA and configured to, in the ON state of the first PA, exhibit a first frequency response in order to attenuate signals about one or more harmonic frequencies of the first frequency band, and in the OFF state of the first PA, exhibit a second frequency response in order to pass signals about the second frequency band between an output of the second PA and a second antenna node.

2. The circuitry of claim 1, further comprising a signal routing circuit coupled to the first filter and the second filter to route signals from one of the first filter and the second filter to an antenna coupled to the signal routing circuit.

3. The circuitry of claim 1, wherein the first frequency band and the second frequency band are non-overlapping.

4. The circuitry of claim 1 wherein the first filter comprises:
   a first inductor coupled in series between an input node and an intermediary node;
   a second inductor coupled in series between the intermediary node and an output node;
   a third inductor coupled in series with a first capacitor between the intermediary node and ground;
   a fourth inductor coupled in series with a second capacitor between the output node and ground.

5. The circuitry of claim 1 wherein the second filter comprises:
   a first inductor coupled in series between an input node and an intermediary node;
   a second inductor coupled in series between the intermediary node and an output node;
   a third inductor coupled in series with a first capacitor between the intermediary node and ground;
   a fourth inductor coupled in series with a second capacitor between the output node and ground; and
   a first switchable capacitor coupled in parallel with the first capacitor between the third inductor and ground.

6. The circuitry of claim 5 wherein:
   when the first PA is in the ON state, the first switchable capacitor is ON, such that the capacitance of the first switchable capacitor is coupled in parallel with the first capacitor between the third inductor and ground; and
   when the first PA is in the OFF state, the first switchable capacitor is OFF, such that the first switchable capacitor forms an open circuit in parallel with the first capacitor between the third inductor and ground.

7. The circuitry of claim 2, wherein the signal routing circuit is one of: a switch, a diplexer.

* * * * *